US011443777B2

(12) United States Patent
Chen et al.

(10) Patent No.: US 11,443,777 B2
(45) Date of Patent: Sep. 13, 2022

(54) BACKSIDE POWER RAIL ARCHITECTURE

(71) Applicant: Arm Limited, Cambridge (GB)

(72) Inventors: Andy Wangkun Chen, Austin, TX (US); Sriram Thyagarajan, Austin, TX (US); Yew Keong Chong, Austin, TX (US); Sony, Noida (IN); Ettore Amirante, Nice (FR); Ayush Kulshrestha, New Delhi (IN)

(73) Assignee: Arm Limited, Cambridge (GB)

( * ) Notice: Subject to any disclaimer, the term of this patent is extended or adjusted under 35 U.S.C. 154(b) by 64 days.

(21) Appl. No.: 17/019,030

(22) Filed: Sep. 11, 2020

(65) Prior Publication Data

US 2022/0084561 A1 Mar. 17, 2022

(51) Int. Cl.
*G11C 7/04* (2006.01)
*G11C 5/14* (2006.01)
*G11C 8/08* (2006.01)

(52) U.S. Cl.
CPC . *G11C 5/14* (2013.01); *G11C 8/08* (2013.01)

(58) Field of Classification Search
CPC .................................. G11C 5/14; G11C 8/08
USPC .......................................................... 365/226
See application file for complete search history.

(56) References Cited

U.S. PATENT DOCUMENTS

| 10,950,546 B1* | 3/2021 | Doornbos | H01L 23/535 |
| 11,200,961 B1* | 12/2021 | Uribe | G11C 29/44 |
| 2015/0121052 A1* | 4/2015 | Emma | G06F 11/348 |
| | | | 713/1 |
| 2021/0225830 A1* | 7/2021 | Liu | H01L 27/0207 |

* cited by examiner

*Primary Examiner* — Hoai V Ho
*Assistant Examiner* — Minh Dinh
(74) *Attorney, Agent, or Firm* — Pramudji Law Group PLLC; Ari Pramudji

(57) ABSTRACT

Various implementations described herein refer to a device having backside power rails including first backside power rails that supply a core voltage to memory logic and second backside power rails that supply a periphery voltage to control logic. In some implementations, at least one first backside power rail may have a rail break that interrupts continuity so as to allow at least one second backside power rail to supply the periphery voltage to the control logic.

19 Claims, 4 Drawing Sheets

400

410 — supply a core voltage to memory logic with first backside power rails

420 — supply a periphery voltage to control logic with second backside power rails 430 — interrupt continuity of at least one first backside power rail with at least one rail break so as to allow at least one second backside power rail to supply the periphery voltage to the control logic

FIG. 4

BACKSIDE POWER RAIL ARCHITECTURE

BACKGROUND

This section is intended to provide information relevant to understanding the various technologies described herein. As the section's title implies, this is a discussion of related art that should in no way imply that it is prior art. Generally, the related art may or may not be considered prior art. It should therefore be understood that any statement in this section should be read in this light, and not as any admission of prior art.

In some memory architecture designs, conventional power rails can be buried in memory, wherein metal power lines can be buried in the substrate, and these lines can be used as power rails for voltage distribution from backside circuitry. However, in these conventional memory designs, memory cells typically use frontside power rails for voltage distribution to frontside circuitry including the memory cells. Unfortunately, conventional memory designs are inefficient in that use of frontside power rails for memory cells suffers from area penalty in fabrication. Therefore, there exists a need to improve conventional memory designs to improve area efficiency of modern memory architecture.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIG. 4 illustrates a diagram of a method for providing buried power rail (BPR) architecture in accordance with implementations described herein.

DETAILED DESCRIPTION

Various implementations described herein refer to backside power rail architecture for control and wordline decoder circuitry in various memory applications. Also, the various schemes and techniques described herein may provide for power distribution architecture that operates to provide a backside power distribution network for memory applications. The various schemes and techniques described herein may provide for frontside/backside power rails that supply core voltage and frontside/backside power rails that supply periphery voltage to memory control circuitry. For instance, the backside power rail architecture may have first backside power rails that supply a core voltage to memory logic and second backside power rails that supply a periphery voltage to control logic. Also, in this instance, at least one first backside power rail may have a rail break that interrupts continuity so as to allow at least one second backside power rail to supply the periphery voltage to the control logic. Also, in some instances, the continuity break may provide a spatial opening so as to thereby allow coupling of the at least one second backside power rail to the memory control circuitry.

In various implementations, backside power distribution schemes and techniques described herein may provide for random access memory (RAM) applications including static RAM (SRAM). For instance, in reference to backside power domains for SRAM technology, metallization may be provided frontside (e.g., above a device) and also backside (e.g., below a device) as buried power rails. In the logic domain, the buried power rails may supply power to memory components in a core memory array such that multiple different power domains may be used to avoid area penalty. The various implementations described herein may also provide for an overall power domain scheme for memory applications, including, e.g., various use of frontside-to-backside transition cells having transition vias. These aspects along with various other features are described in greater detail herein.

Various implementations of backside power rail architecture along with various backside power distribution schemes and techniques related thereto will be described in greater detail herein with reference to FIGS. 1-4.

Figure 1:
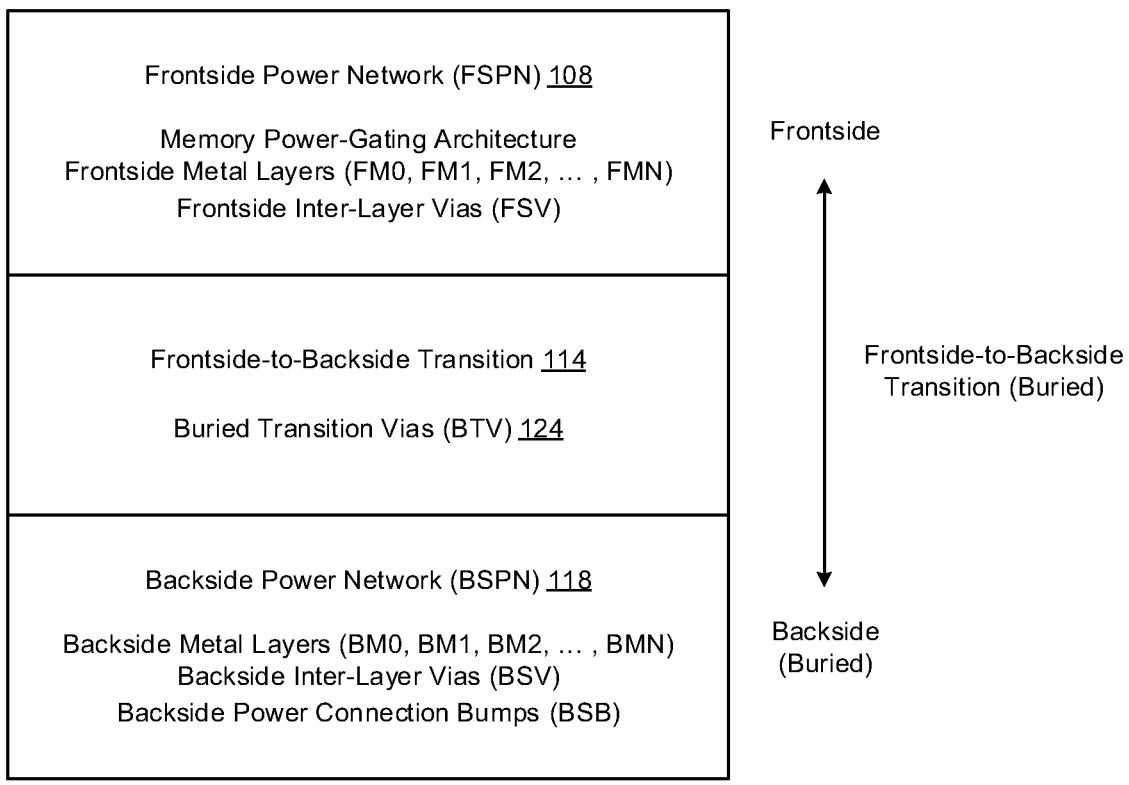
FIG. 1 illustrates a schematic diagram of buried power rail (BPR) architecture in accordance with various implementations described herein.

FIG. 1 illustrates a diagram 100 of buried power rail (BPR) architecture 104 in accordance with various implementations described herein.

In various implementations, the BPR architecture 104 may be implemented as a system or a device having various integrated circuit (IC) components that are arranged and coupled together as an assemblage or combination of parts that provide for a physical circuit design and/or related structures. In some instances, a method of designing, providing and building the BPR architecture 104 as an integrated system or device may involve use of the various IC circuit components described herein to thereby implement various backside power distribution schemes and techniques associated therewith. The BPR architecture 104 may be integrated with computing circuitry and related components on a single chip, and the BPR architecture 104 may be implemented in some embedded systems for automotive, electronic, mobile, server and Internet-of-things (IoT) applications.

As shown in FIG. 1, the BPR architecture 104 may include a frontside power network (FSPN) 108 configured for memory architecture, such as, e.g., backside power for memory control circuitry. In some instances, the frontside power network (FSPN) 108 may include frontside metal layers that supply a core voltage in multiple voltage domains, wherein the one or more voltage domains of the core voltage may refer to an internal core voltage domain (VDDC) and/or an external core voltage domain (VDDCE).

In some implementations, the frontside power network (FSPN) 108 may include various types of components, circuitry, and metals layers. For instance, the frontside power network (FSPN) 108 may include frontside power rails that are coupled to memory circuitry having, e.g., an array of bitcells arranged in columns and rows along with header logic and power-gating control logic. Also, in some instances, the frontside power network (FSPN) 108 may include a number (N) of frontside metal layers (e.g., FM0, FM1, FM2, . . . , FMN) along with frontside inter-layer vias (FSV).

The BPR architecture 104 may include a backside power network (BSPN) 118 that provides power distribution for memory control circuitry, such as, e.g., column multiplexer circuitry (COLMUX), sense amplifier circuitry (SA), powergate input/output (PG I/O) circuitry, and powergate control (PG_CNTL). Also, the backside power network (BSPN) 118 may be configured to provide power in various different voltage domains for the memory control logic that is disposed frontside. Thus, the backside power distribution network (BSPN) 118 may be configured to supply core voltages, periphery voltages and/or ground.

In some implementations, the backside power network (BSPN) 118 may include one or more buried metal layers that supply a periphery voltage in multiple domains, and the multiple domains of the periphery voltage refer to an internal periphery voltage domain (VDDP) and an external periphery voltage domain (VDDPE). Also, the multiple domains of the periphery voltage may refer to an internal core voltage domain (VDDC) and an external core voltage domain (VDDCE). Also, in various instances, a ground supply may refer to an external ground (VSSE).

In some implementations, the backside power network (BSPN) 118 may include backside metals layers (e.g., BM0). For instance, the backside power network (BSPN) 118 may include a backside power network with backside power rails. Also, the backside power network (BSPN) 118 may have backside metal layers (e.g., BM0, BM1, BM2, . . . , BMN) along with backside inter-layer vias (BSV). The backside power network (BSPN) 118 may also include backside power connection bumps (BSB).

The BPR architecture 104 may have frontside-to-backside transition architecture 114 along with buried transition vias (BTV) that are utilized for coupling the buried backside power network (BSPN) to the frontside power network (FSPN). The buried transition vias (BTV) 124 may be configured to provide for a power transition between the backside power network (BSPN) 118 to the frontside power network (FSPN) 108. Thus, in some instances, the BPR architecture 104 may be configured for transitioning the backside power rails of the backside power network to the frontside power rails of the frontside power network so as to provide power taps to the memory circuitry from the backside power network (BSPN). Also, the frontside-to-backside transition 114 may be referred to as buried transition architecture that may have backside-to-frontside transition cells along with the buried transition vias 124 that provide a coupling transition between the backside power network (BSPN) 118 and the frontside power network (FSPN) 108.

In some implementations, the backside power rail (BPR) architecture 104 may be configured to operate as power distribution network architecture that utilizes backside buried metal in the backside power network (BSPN) for the backside power rails and also utilizes frontside metal of the frontside power network (FSPN) for the frontside power rails. Also, the frontside power network (FSPN) may use frontside metal, and the backside power network (BSPN) may use backside buried metal that is disposed underneath the frontside metal of the frontside power network (FSPN). Also, the transition architecture may refer to buried transition architecture disposed between the backside buried metal of the backside power network (BSPN) and the frontside metal of the frontside power network (FSPN).

In some implementations, the buried transition architecture may be configured to use backside-to-frontside transition cells with the transition vias that couple backside buried metal of the backside power network (BSPN) to the frontside metal of the frontside power network (FSPN). The frontside power network (FSPN) may use the frontside metal layers to supply a core voltage in one or more voltage domains, such as, e.g., an internal core voltage domain (VDDC) and/or an external core voltage domain (VDDCE). Also, the backside power network (BSPN) may use the one or more buried metal layers that may supply a periphery voltage in multiple domains, such as, e.g., an internal periphery voltage domain (VDDP) and an external periphery voltage domain (VDDPE). In some implementations, the BSPN may be configured to provide, supply and utilize the internal core voltage domain (VDDC) and/or the external core voltage domain (VDDCE).

In various implementations, the various schemes and techniques described herein may provide for power distribution network architecture for transitioning power from backside to frontside with buried power rails. Also, the power distribution network architecture may be configured to use backside buried metal for backside power rails and use frontside metal for frontside power rails. Also, in some instances, the power distribution network architecture may use header-based power tapping circuitry in multiple different voltage domains, such as, e.g., VDDC, VDDCE, VDDP, VDDPE, along with a single ground, such as, e.g., an external ground (VSSE). These aspects and various other features and characteristics are described in greater detail herein below in reference to FIGS. 2-3.

Figure 2:
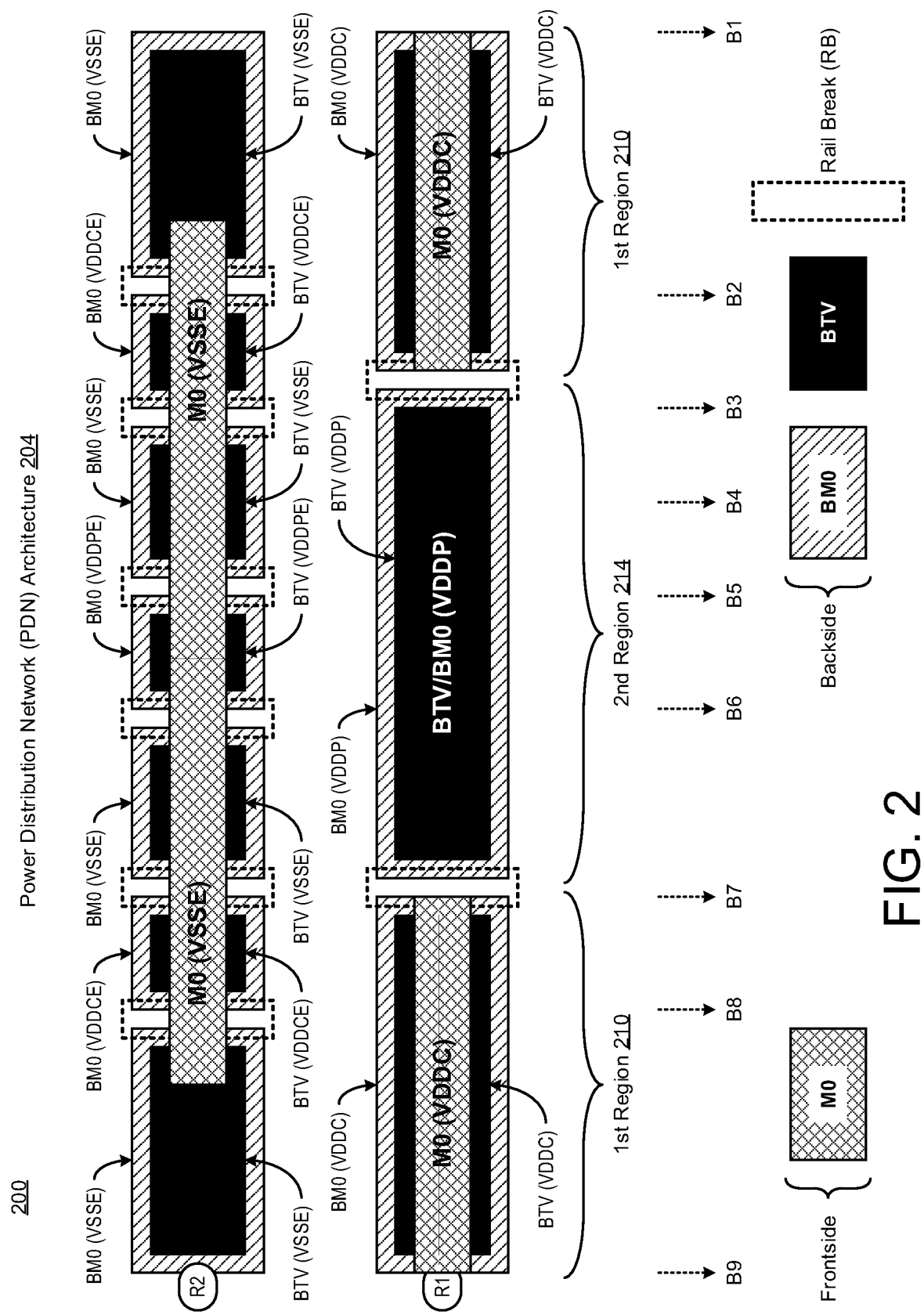
FIG. 2 illustrates a schematic diagram of power distribution network (PDN) in accordance with various implementations described herein.

FIG. 2 illustrates a schematic diagram 200 related to power distribution network (PDN) architecture 204 in accordance with various implementations described herein.

In various implementations, the PDN architecture 204 may be implemented as a system or a device having various integrated circuit (IC) components that are arranged and coupled together as an assemblage or combination of parts that provide for a physical circuit design and related structures. In some instances, a method of designing, providing and/or building the PDN architecture 204 as an integrated system or device may involve use of the various IC circuit components described herein to thereby implement various backside power distribution techniques associated therewith. Also, in some instances, the PDN architecture 204 may be integrated with computing circuitry and related components on a single chip, and the PDN architecture 204 may be implemented in various embedded systems for automotive, electronic, mobile, server and Internet-of-things (IoT) applications.

As shown in FIG. 2, the power distribution network (PDN) 204 may include power distribution architecture having a frontside power network with frontside power rails (e.g., M0) and a backside power network with backside power rails (e.g., BM0). The frontside power rails may be configured to supply core voltage in various core voltage domains (e.g., VDDC, VDDCE) to memory circuitry, and also, the backside power rails may be configured to supply periphery voltage in various periphery voltage domains (e.g., VDDP, VDDPE) to the memory control circuitry. Also, the power distribution architecture may use transition vias that provide for a coupling transition from the backside power rails of the backside power network to the frontside power rails of the frontside power network. The transition vias may refer to buried transitions vias (BTV) 214 that are configured to provide the coupling transition between the backside power network and the frontside power network.

The frontside power network of the power distribution network (PDN) 204 may have various types of components, circuits, and metal layers that are coupled to the core voltage domain (VDDC, VDDCE). For instance, the frontside power network (FSPN) may include various memory related circuits and/or components on the top and bottom (bot) and on the right-side and the left-side that operate in the core voltage domains (VDDC, VDDCE). In some instances, the term top may be referred to as upper, and also, the term bottom (bot) may be referred to as lower, wherein a top (or upper) layer may be disposed above a bottom (or lower)

layer, which may be relative their respective position in a multi-layered memory stack in various memory applications.

The backside power network (BSPN) of the power distribution network (PDN) 204 may have various buried metal layers that are coupled to the one or more core voltage and/or periphery voltage domains (VDDCE, VDDP, VDDPE). For instance, the backside power network (BSPN) may be coupled to various memory circuits and/or components that may be configured to operate in the internal periphery voltage domain (VDDP) and/or the external periphery voltage domain (VDDPE). The transition architecture may include buried transition vias (BTV) that provide power taps for transitional coupling the backside metals (BM0) of the backside power rails to the frontside metals (M0) of the frontside power rails. Also, in some instances, the backside power rail architecture may be configured to provide the BTVs as coupling transitions (and/or power delivery transitions) between the backside power rails and frontside power rails so as to provide backside-to-frontside power taps to the frontside power network from the backside power network.

In some implementations, the frontside power network may be configured to use frontside metal (e.g., M0) for the frontside power rails, and also, the backside power network may be configured to use backside buried metal (e.g., BM0) for the backside power rails, which are disposed underneath the frontside metal of the frontside power network. Also, in some instances, the backside power rail architecture may be configured to operate as power distribution network architecture that provides the buried transition vias (BTV), which may be disposed between the frontside metal of the frontside power network and the backside buried metal of the backside power network.

In some implementations, the backside power rail schemes and techniques that are described herein may provide for power distribution network (PDN) architecture that uses intermixing of backside-to-frontside power rails. As described herein, the power distribution network architecture may be configured to utilize backside buried metal for backside power rails and also utilize frontside metal for frontside power rails. Also, the power distribution network architecture may use control circuitry in multiple different voltage domains, such as, e.g., VDDC, VDDCE, VDDP, VDDPE, along with a single ground, such as, e.g., VSSE. Also, the power distribution network architecture may incorporate use of buried power rails with buried transition vias (BTV) and buried metal layers (BM0).

As shown in FIG. 2, the power distribution network (PDN) 204 may have one or more power rails (R1-R2), including, e.g., a first power rail (R1) and a second power rail (R2). In the power rails (R1-R2), the frontside metal (M0) may be formed above the backside metal (BM0), and the BTV metal may be used to couple the frontside metal (M0) to the backside metal (BM0). In some implementations, portions of the power rails (R1-R2) may be coupled to different power supplies in different power domains. For instance, as shown in FIG. 2, portions of the power rails (R1-R2) may be used to couple FS metal (M0) and BS metal (BM0) to ground, such as, e.g., external ground (VSSE). Also, as shown in FIG. 2, other portions of the power rails (R1-R2) may be used to couple the frontside metal (M0) and the backside metal (BM0) to various different periphery domains, such as, e.g., the internal and external periphery domains (VDDP, VDDPE).

In some implementations, the backside power rail (BPR) architecture may include a first row (R1) having first backside power rails in first regions 210 that supply a core voltage (VDDC) to memory logic and second backside power rails in a second region 214 that supply a periphery voltage (VDDP) to control logic. As shown in FIG. 2, at least one first backside power rail may be configured with one or more rail breaks (RB) that interrupt continuity so as to thereby allow at least one second backside power rail in the second region 214 to supply the periphery voltage (VDDP) to the control logic. The first backside power rails may provide a first net (VDDC) that supplies the core voltage (VDDC) to the memory logic, and the second backside power rails may provide a second net (VDDP) that supplies the periphery voltage (VDDP) to the control logic. The rail break (RB) may provide a spatial opening in the at least one first backside power rail to allow coupling of the at least one second backside power rail to the control logic. In some instances, the core voltage may refer to an internal core voltage (VDDC), and the periphery voltage may refer to an internal periphery voltage (VDDP).

In some implementations, the backside power rail (BPR) architecture may include a second row (R2) having first backside power rails that supply a core voltage (VDDCE) to the memory logic, second backside power rails that supply a periphery voltage (VDDPE) to the control logic, and third backside power rails that couple the memory logic and the control logic to an external ground (VSSE). As shown in FIG. 2, at least one first backside power rail may have multiple rail breaks (RB) that interrupt continuity so as to thereby allow at least one second backside power rail to supply the periphery voltage (VDDPE) to the control logic and so as to thereby allow at least one third backside power rail to couple the memory logic and the control logic to ground (VSSE). The first backside power rails may provide a first net (VDDCE) that supplies the core voltage (VDDCE) to the memory logic, and also, the second backside power rails may provide a second net (VDDPE) that supplies the periphery voltage (VDDPE) to the control logic. The multiple rail breaks (RB) provide multiple spatial openings in the at least one first backside power rail so as to allow coupling of the at least one second backside power rail to the control logic and so as to allow at least one third backside power rail to couple the memory logic and the control logic to ground (VSSE). In some instances, the core voltage may refer to the external core voltage (VDDCE), and the periphery voltage may refer to the external periphery voltage (VDDPE).

In some implementations, as shown in FIG. 2, the first power rail (R1) may use a frontside power rail (M0) with rail breaks (RB) that provide a break in continuity to thereby allow one or more corresponding backside power rails (BTV/BM0) to supply the periphery voltage (VDDP) to the memory control circuitry, which is disposed frontside. Also, the second power rail (R2) may have a frontside power rail (M0) that is continuous, and the second power rail (R2) may be coupled to ground (VSSE). However, various other configurations with other voltage domains may be utilized to support continuous rails and/or discontinuous rails with one or more continuity breaks. Thus, the various implementations described herein may use backside metal having substantially low resistance for power distribution. As such, the PDN 204 may be configured to use a novel architecture of backside power distribution for memory control and wordline driver circuitry with backside power rails to improve current-resistance (IR) drop, performance, and area of memory control circuitry.

In some implementations, as shown in FIG. 2, the PDN architecture 204 may provide for a backside power rail (BPR) architecture having multiple rows of backside power rails that are configured to supply various different core and periphery voltage domains (e.g., VDDC, VDDCE, VDP, VDDPE). For instance, the rows of backside power rails may be used to supply power to memory circuitry having, e.g., memory logic and control logic. The rows (R1-R2) of backside power rails may have one or more rail breaks (RB) that allow multiple different nets (VDDC, VDDCE, VDP, VDDPE, VSSE) to supply power to the memory logic and the control logic. Also, alignment of the rail breaks (RB) in the one or more first regions 210 may allow for core voltage in multiple domains (e.g., VDDC, VDDCE) to be supplied from different rows (R1, R2) of the backside power rails. Also, alignment of the rail breaks (RB) in one or more second regions 214 may allow for periphery voltage in multiple domains (e.g., VDDP, VDDPE) to be supplied from different rows (R1, R2) of the backside power rails. As shown in FIG. 2, the multiple rows (R1, R2) of the backside power rails may include a first row (R1) of backside power rails and a second row (R2) of backside power rails, wherein the first row (R1) of backside power rails may have one or more rail breaks (RB) that allow the multiple different nets (VDDC, VDDP) to supply power to the memory logic and the control logic, and wherein the second row (R2) of backside power rails may also have one or more rail breaks (RB) that allow multiple different nets (VDDCE, VDDPE, VSSE) to supply power to the memory logic and the control logic.

Also, in some implementations, portions of the first row (R1) of the backside power rails in the one or more first regions 210 may be vertically aligned with corresponding portions of the second row (R2) of the backside power rails in the one or more first regions 210. Also, portions of the first row (R1) of the backside power rails in the one or more second regions 214 may be vertically aligned with the corresponding portions of the second row (R2) of the backside power rails in the one or more second regions 214. As shown in FIG. 2, the one or more rail breaks (RB) may provide spatial openings in the backside power rails to thereby allow the multiple different nets (VDDC, VDDCE, VDP, VDDPE, VSSE) to supply power to the memory logic and the control logic. As described herein, the multiple domains of the core voltage may include the internal core voltage domain (VDDC) and the external core voltage domain (VDDCE), and also, the multiple domains of the periphery voltage include the internal periphery voltage domain (VDDP) and the external periphery voltage domain (VDDPE), and also, one or more backside power rails are coupled to the external ground (VSSE).

In some implementations, the PDN 204 may provide and couple the power rails (R1-R2) to the memory control circuitry, which is formed frontside and above the backside power rails. Further details related to the voltage domain network (VDN) 304 including the memory architecture (e.g., core array, decoders, drivers, headers, control, etc.) is described herein below in reference to FIG. 3. Also, in reference to FIGS. 2-3, the alignment lines (B1-B10) in FIG. 2 correspond to the same alignment lines (B1-B10) in FIG. 3.

Figure 3:
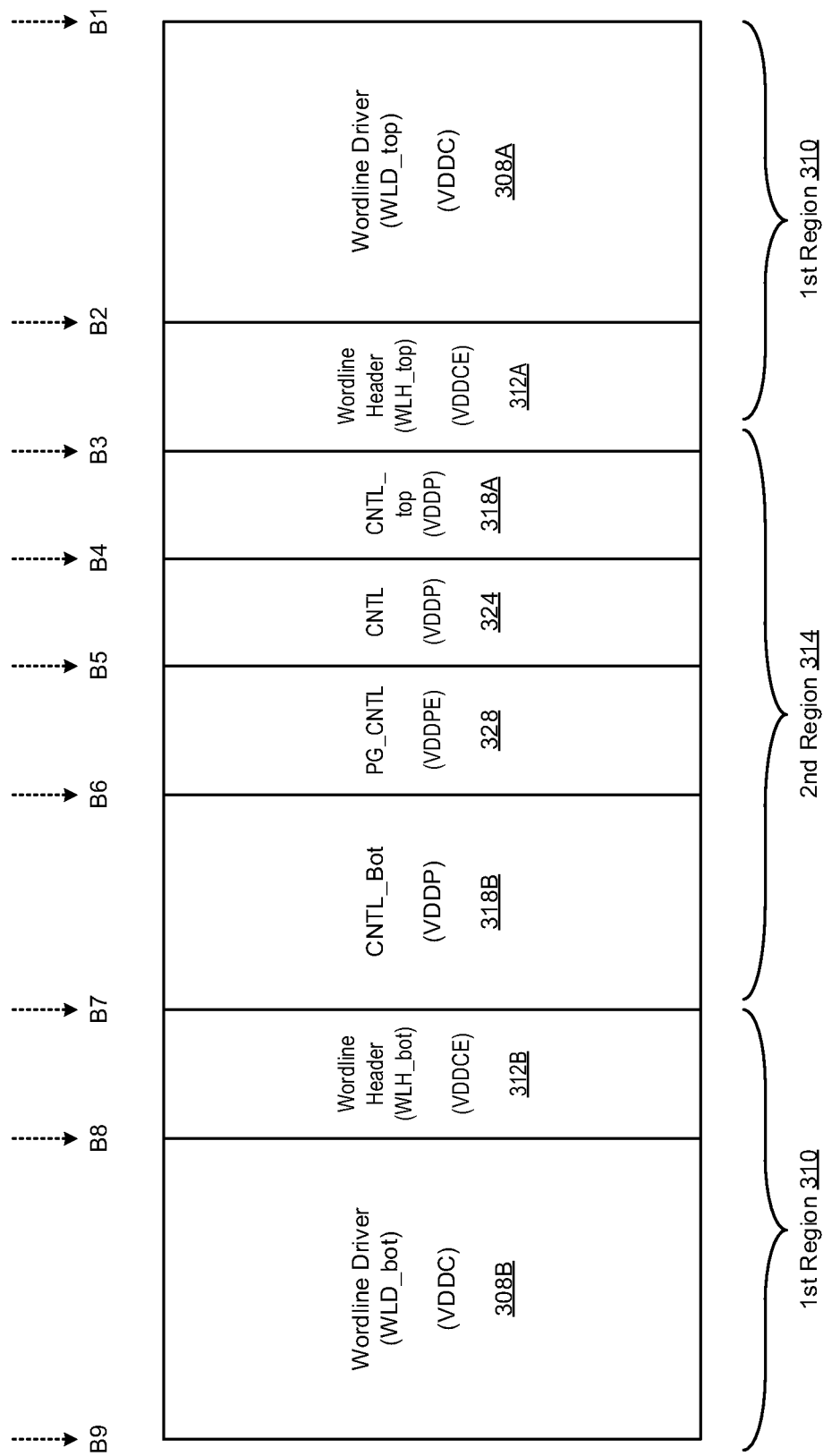
FIG. 3 illustrates a schematic diagram of voltage domain network (VDN) in accordance with various implementations described herein.

FIG. 3 illustrates a schematic diagram of voltage domain network (VDN) 304 in accordance with various implementations described herein.

In various implementations, the voltage domain network (VDN) architecture 304 may be implemented as a system or device having various integrated circuit (IC) components that are arranged and coupled together as an assemblage or some combination of parts that provide for a physical circuit design and related structures. In some instances, a method of designing, providing and building the VDN 304 as an integrated system or device may involve use of various IC circuit components described herein so as to implement various backside power distribution schemes and techniques associated therewith. Also, in some instances, the VDN 304 may be integrated with computing circuitry and related components on a single chip, and the VDN 304 may be implemented in various embedded systems for automotive, electronic, mobile, server and Internet-of-things (IoT) applications.

As shown in FIG. 3, the voltage domain network (VDN) 304 may include the memory control logic and/or circuitry having various circuits and/or components, including a wordline decoder/controller 324, wordline drivers 308A, 308B and wordline headers 312A, 312B that are configured to operate as power-gating headers for power-gating the wordline drivers 308A, 308B. In some instances, the wordline drivers 308A, 308B may have an upper wordline driver (WLD_top 308A) for an upper core array along with a lower wordline driver (WLD_bot 308B) for a lower core array. The wordline headers 312A, 312B may include an upper wordline header (WLH_top 312A) that may operate as an upper power-gating header for the upper wordline driver (WLD_top 308A) and also a lower wordline header (WLH_bot 312B) that operates as a lower power-gating header for the lower wordline driver (WLD_bot 308B). The memory control logic and/or circuitry may include an upper controller (CNTL_top 318A) for the upper wordline driver (WLD_top 308A) and a lower controller (CNTL_bot 318B) for the lower wordline driver (WLD_bot 308B). Also, the memory control logic and/or circuitry may include a power-gating controller (PG_CNTL 328) that may be configured for power-gating the wordline controller (CNTL 324).

In some implementations, the circuits and/or components of the memory control circuitry may be configured to operate in various different voltage domains. For instance, as shown in FIG. 3, the wordline drivers (WLD_top 308A, WLD_bot 308B) may be configured to operate in the VDDC domain, and also, the wordline headers (WLH_top 312A, WLH_bot 312B) may be configured to operate in the VDDCE domain. Also, in some implementations, the wordline controller (CNTL 324) may be configured to operate in the VDDPE domain, and also, the upper controller (CNTL_top 318A) and a lower controller (CNTL_bot 318B) may be configured to operate in the VDDP domain. Also, in some implementations, the power-gating controller (PG_CNTL 328) may be configured to operate in the VDDPE domain.

As shown in Reference to FIGS. 2-3, the combination of the power distribution network (PDN) 204 in FIG. 2, and the voltage domain network (VDN) in FIG. 3 may be configured to provide a power rail architecture for memory control applications. Therefore, in some implementations, as shown in FIGS. 2-3, the power rail architecture may include a frontside power distribution network (FPDN) with frontside power rails that are coupled to the memory control circuitry and a backside power distribution network (BPDN) having backside power rails. Also, as shown in FIG. 2, at least one of the frontside power rails may have one or more rail breaks in continuity that provide spatial openings to allow coupling of at least one corresponding backside power rail to the memory control logic. In some instances, the frontside power rails may be formed with frontside metal, and the backside power rails may be formed with buried metal that is disposed underneath the frontside metal.

In some implementations, the frontside power distribution network (FPDN) may supply core voltage to the memory control circuitry by way of the frontside power rails, and the backside power distribution network (BPDN) may supply periphery voltage by way of the backside power rails. Also, the backside power rails may refer to buried power rails that are disposed underneath the frontside power rails. The power rail architecture may also include transition cells that provide frontside-to-backside power distribution from the backside power distribution network to the frontside distribution network, and also, the transition cells may include buried transition vias that are configured to couple the at least one corresponding backside power rail to the memory control circuitry.

Moreover, the core voltage may be supplied in one or more different core voltage domains including, e.g., the internal core voltage domain (VDDC) and the external core voltage domain (VDDCE). Also, the periphery voltage may be supplied in different periphery voltage domains including, e.g., the internal periphery voltage domain (VDDP) and/or the external periphery voltage domain (VDDPE). Also, one or more frontside power rails and/or one or more backside power rails may be coupled to the external ground (VSSE).

In some implementations, as shown in FIG. 3, the VDN architecture 304 provides multiple regions 310, 314 that correspond to and align with the multiple regions 210, 214 in FIG. 2. The multiple regions 310, 314 refer to memory logic in first regions 310 that have wordline headers 312A, 312B and wordline drivers 308A, 308B, and the multiple regions 310, 314 refer to the control logic in second regions 314 that have a wordline controller 324 along with various other control logic. The wordline drivers 308A, 308B include the upper wordline driver 308A for an upper core array and the lower wordline driver 308B for a lower core array. The wordline headers 312A, 312B may include the upper wordline header 312A that operates as an upper power-gating header for the upper wordline driver 308A along with the lower wordline header 312B that operates as a lower power-gating header for the lower wordline driver 308B. The control logic may include the upper controller 318A for the upper wordline driver 308A along with the lower controller 318B for the lower wordline driver 308B, and also, the control logic may include the powergate controller 328 that is configured for power-gating the wordline controller 324.

FIG. 4 illustrates a process flow diagram of a method 400 for providing buried power rail (BPR) architecture in accordance with implementations described herein.

It should be understood that even though the method 400 indicates a particular order of operation execution, in some cases, various particular portions of the operations may be executed in a different order, and on different systems. In other cases, additional operations and/or steps may be added to and/or omitted from method 400. Also, method 400 may be implemented in hardware and/or software. If implemented in hardware, the method 400 may be implemented with various components and/or circuitry, as described herein in reference to FIGS. 1-3. Also, if implemented in software, the method 400 may be implemented as a program and/or software instruction process configured for providing various backside power distribution schemes and techniques, as described herein. Also, if implemented in software, various instructions related to implementing method 400 may be stored in memory and/or a database. For instance, various types of computing devices having a processor and memory may be configured to perform method 400.

In various implementations, the method 400 may refer to a method of designing, providing, building, fabricating and/or manufacturing backside power rail architecture as an integrated system, device and/or circuit that may involve use of the various IC circuit components described herein so as to implement backside power distribution schemes and techniques associated therewith. In some implementations, the backside power rail architecture may be integrated with computing circuitry and other related components on a single chip, and the backside power distribution circuitry may be implemented in various embedded systems for automotive, electronic, mobile, server and Internet-of-things (IoT) applications, including remote sensor nodes.

At block 410, method 400 may supply (or provide) a core voltage to memory logic with first backside power rails. The first backside power rails provide a first net that supplies the core voltage to the memory logic. The core voltage may refer to an internal core voltage (VDDC) or an external core voltage (VDDCE). The memory logic may have wordline headers and wordline drivers. The wordline drivers may include an upper wordline driver for an upper core array and a lower wordline driver for a lower core array, and the wordline headers may include an upper wordline header that operates as an upper power-gating header for the upper wordline driver and a lower wordline header that operates as a lower power-gating header for the lower wordline driver.

At block 420, method 400 may supply (or provide) a periphery voltage to control logic with second backside power rails. The second backside power rails provide a second net that supplies the periphery voltage to the control logic. The periphery voltage may refer to an internal periphery voltage (VDDP) or an external periphery voltage (VDDPE). Also, the control logic may have a wordline controller. The control logic includes an upper controller for the upper wordline driver and a lower controller for the lower wordline driver, and also, the control logic includes a powergate controller for power-gating the wordline controller.

At block 430, method 400 may interrupt continuity of at least one first backside power rail with at least one rail break so as to allow at least one second backside power rail to supply the periphery voltage to the control logic. The at least one rail break may provide a spatial opening in the at least one first backside power rail so as to allow coupling of the at least one second backside power rail to the control logic.

In some implementations, method 400 may provide a frontside power distribution network that provides frontside power rails, and method 400 may provide a backside power distribution network that may provide the first backside power rails and the second backside power rails, which are disposed underneath the frontside power rails. Also, method 400 may provide transition cells that are configured for frontside-to-backside power distribution. The first backside power rails and the second backside power rails may refer to buried power rails that are disposed underneath the frontside power rails, and also, the transition cells may refer to buried transition vias, which are used to couple the buried power rails to the memory logic and the control logic. The frontside power rails may be formed with frontside metal, and the backside power rails may be formed with buried backside metal.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device having first backside power rails that supply a core voltage to memory logic, and the device may include second backside power rails that supply a periphery voltage to control logic. At least one first backside power rail may have a rail break that interrupts continuity so as to allow at least one second backside power rail to supply the periphery voltage to the control logic.

Described herein are various implementations of a device having first backside power rails that supply a core voltage to memory logic, and the device may include second backside power rails that supply a periphery voltage to control logic. Also, the device may include third backside power rails that couple the memory logic and the control logic to ground. In some instances, at least one first backside power rail has multiple rail breaks that interrupt continuity so as to allow at least one second backside power rail to supply the periphery voltage to the control logic and so as to allow at least one third backside power rail to couple the memory logic and the control logic to ground.

Described herein are various implementations of a device with memory circuitry having memory logic and control logic. The device may include rows of backside power rails having one or more rail breaks that allow multiple different nets to supply power to the memory logic and the control logic. In some instances, alignment of the rail breaks in one or more first regions allow for core voltage in multiple domains to be supplied from different rows of the backside power rails. In some instances, alignment of the rail breaks in one or more second regions may allow for periphery voltage in multiple domains to be supplied from different rows of the backside power rails.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing refers to implementations of various techniques described herein, various other and further implementations may be devised in accordance with the disclosure herein, which may be determined by the claims that follow.

Although the subject matter has been described in language that is specific to various structural features and/or methodological acts, it is to be understood that subject matter defined in the appended claims is not necessarily limited to the specific features or acts described above. Rather, specific features and acts described above are disclosed as example forms of implementing the claims.

What is claimed is:

1. A device, comprising:
   first backside power rails that supply a core voltage to memory logic; and
   second backside power rails that supply a periphery voltage to control logic,
   wherein at least one first backside power rail has a rail break that interrupts continuity so as to allow at least one second backside power rail to supply the periphery voltage to the control logic, and
   wherein the rail break provides a spatial opening in the at least one first backside power rail to allow coupling of the at least one second backside power rail to the control logic.

2. The device of claim 1, wherein the first backside power rails provide a first net that supplies the core voltage to the memory logic, and wherein the second backside power rails provide a second net that supplies the periphery voltage to the control logic.

3. The device of claim 1, wherein the core voltage refers to an internal core voltage (VDDC), and wherein the periphery voltage refers to an internal periphery voltage (VDDP).

4. The device of claim 1, wherein the memory logic has wordline headers and wordline drivers, and wherein the control logic has a wordline controller.

5. The device of claim 4, wherein:
   the wordline drivers include an upper wordline driver for an upper core array and a lower wordline driver for a lower core array, and
   the wordline headers include an upper wordline header that operates as an upper power-gating header for the upper wordline driver and a lower wordline header that operates as a lower power-gating header for the lower wordline driver.

6. The device of claim 5, wherein:
the control logic includes an upper controller for the upper wordline driver and a lower controller for the lower wordline driver, and the control logic includes a powergate controller for power-gating the wordline controller.

7. A device, comprising:
first backside power rails that supply a core voltage to memory logic;
second backside power rails that supply a periphery voltage to control logic, wherein at least one first backside power rail has a rail break that interrupts continuity so as to allow at least one second backside power rail to supply the periphery voltage to the control logic;
a frontside power distribution network that provides frontside power rails;
a backside power distribution network that provides the first backside power rails and the second backside power rails disposed underneath the frontside power rails; and
transition cells that provide frontside-to-backside power distribution.

8. The device of claim 7, wherein:
the first backside power rails and the second backside power rails refer to buried power rails that are disposed underneath the frontside power rails, and
the transition cells refer to buried transition vias that are used to couple the buried power rails to the memory logic and the control logic.

9. The device of claim 7, wherein:
the frontside power rails are formed with frontside metal, and
the backside power rails are formed with buried metal that is disposed underneath the frontside metal.

10. A device, comprising:
first backside power rails that supply a core voltage to memory logic; and
second backside power rails that supply a periphery voltage to control logic,
third backside power rails that couple the memory logic and the control logic to ground,
wherein at least one first backside power rail has multiple rail breaks that interrupt continuity so as to allow at least one second backside power rail to supply the periphery voltage to the control logic and so as to allow at least one third backside power rail to couple the memory logic and the control logic to ground.

11. The device of claim 10, wherein the first backside power rails provide a first net that supplies the core voltage to the memory logic, and wherein the second backside power rails provide a second net that supplies the periphery voltage to the control logic.

12. The device of claim 10, wherein the multiple rail breaks provide spatial openings in the at least one first backside power rail to allow coupling of the at least one second backside power rail to the control logic and to allow at least one third backside power rail to couple the memory logic and the control logic to ground.

13. The device of claim 10, wherein the core voltage refers to an external core voltage (VDDCE), and wherein the periphery voltage refers to an external periphery voltage (VDDPE).

14. The device of claim 10, further comprising:
a frontside power distribution network that provides frontside power rails;
a backside power distribution network that provides the first backside power rails, the second backside power rails, and the third backside power rails that are disposed underneath the frontside power rails; and
transition cells that provide frontside-to-backside power distribution.

15. A device, comprising:
memory circuitry including memory logic and control logic; and
rows of backside power rails having one or more rail breaks that allow multiple different nets to supply power to the memory logic and the control logic,
wherein alignment of the rail breaks in one or more first regions allow for core voltage in multiple domains to be supplied from different rows of the backside power rails, and
wherein alignment of the rail breaks in one or more second regions allow for periphery voltage in multiple domains to be supplied from different rows of the backside power rails.

16. The device of claim 15, wherein:
the multiple rows of the backside power rails include a first row of backside power rails and a second row of backside power rails,
the first row of backside power rails has one or more rail breaks that allow the multiple different nets to supply power to the memory logic and the control logic, and
the second row of backside power rails has one or more rail breaks that allow multiple different nets to supply power to the memory logic and the control logic.

17. The device of claim 16, wherein:
portions of the first row of the backside power rails in the one or more first regions are vertically aligned with corresponding portions of the second row of the backside power rails in the one or more first regions, and
portions of the first row of the backside power rails in the one or more second regions are vertically aligned with corresponding portions of the second row of the backside power rails in the one or more second regions.

18. The device of claim 15, wherein the one or more rail breaks provide spatial openings in the backside power rails to allow the multiple different nets to supply power to the memory logic and the control logic.

19. The device of claim 15, wherein:
the multiple domains of the core voltage include an internal core voltage domain (VDDC) and an external core voltage domain (VDDCE),
the multiple domains of the periphery voltage include an internal periphery voltage domain (VDDP) and an external periphery voltage domain (VDDPE), and
one or more backside power rails are coupled to an external ground (VSSE).

* * * * *